United States Patent [19]

Hadwin

[11] Patent Number: 5,087,827
[45] Date of Patent: Feb. 11, 1992

[54] VARIABLE VOLTAGE TRANSITION CIRCUIT

[75] Inventor: Matthew J. Hadwin, Beaverton, Oreg.

[73] Assignee: Tektronix, Inc., Beaverton, Oreg.

[21] Appl. No.: 652,859

[22] Filed: Feb. 11, 1991

[51] Int. Cl.$^5$ .................. H03K 17/56; H03K 3/01
[52] U.S. Cl. .................. 307/246; 307/270;
    307/491; 307/542; 307/263
[58] Field of Search ............ 307/246, 542, 549, 551,
    307/264, 263, 262, 491, 228, 270; 320/1

[56] References Cited

U.S. PATENT DOCUMENTS

| | | | |
|---|---|---|---|
| 3,932,773 | 1/1976 | Lüscher et al. | 307/270 |
| 4,016,498 | 4/1977 | Hadley | 307/228 X |
| 4,199,693 | 4/1980 | Bennett | 307/246 |
| 4,216,393 | 8/1980 | Gillberg et al. | 307/270 |
| 4,321,482 | 3/1982 | Schröder et al. | 307/262 |
| 4,384,216 | 5/1983 | Pricer | 307/262 |
| 4,555,655 | 11/1985 | Tanaka | 320/1 |
| 4,631,422 | 12/1986 | Piasecki | 307/549 X |
| 4,730,123 | 3/1988 | Wegener et al. | 307/270 X |
| 4,877,982 | 10/1989 | Walker | 307/571 |
| 5,019,719 | 5/1991 | King | 307/246 |

Primary Examiner—Eugene R. LaRoche
Assistant Examiner—Son Dinh
Attorney, Agent, or Firm—Francis I. Gray

[57] ABSTRACT

An improved variable voltage transition circuit of the type that switches a capacitor between charging and discharging current sources when an input voltage transitions, the capacitor being coupled via respective Schottky diodes to tracking clamp circuits, has a compensation circuit that includes second current sources that match the charging and discharging current sources and uses regenerative feedback to turn on and off the Schottky diodes virtually instantaneously when the input voltage transitions. A fixed clamp circuit and a bias switch circuit are coupled between the tracking clamp circuits and one side of the transition switch to provide a conductive path for the second current sources that results in a change in the bias of the tracking clamp circuits such that when the input voltage transitions the "on" Schottky diode is instantaneously turned off, and the "off" Schottky diode is turned completely on very quickly after it starts to conduct at the end of the transition.

3 Claims, 5 Drawing Sheets

VARIABLE VOLTAGE TRANSITION CIRCUIT

BACKGROUND OF THE INVENTION

The present invention relates to transition circuits, and more particularly to a variable voltage transition circuit with improved transition characteristics.

An ideal variable voltage transition circuit provides a perfectly linear edge between transition levels with hard clamp at the desired level amplitudes, as shown in FIG. 1. A constant current charging a capacitor yields a voltage which is linear with respect to time. A classical approach to a variable voltage transition circuit is shown schematically in FIG. 2. A charging current source I1 and a discharging current source I2 are alternately switched into a capacitive load C. The slope of the voltage transition is controlled by the magnitude of the current as well as the amount of load capacitance, i.e., $dv/dt = I/C$. The circuit has several states of operation which are described below with respect to FIG. 3.

Prior to time t1 transistors Q2 and Q3 are turned on along with diode D5, with the current through D5 equal to the current I2 through Q3 to hold the potential of the capacitor C constant, i.e., current I2 flows from voltage rail Vc through transistor Q5 of the clamp circuit, Schottky diode D5 and transistor Q3 to voltage rail Vee, and current I1 flows through transistor Q2 to ground. At time t1 transistors Q1 and Q4 turn on in response to a transition in the differential input signal Vin, and transistors Q2 and Q3 are turned off. However diode D5 continues to conduct until its forward voltage is decreased below its threshold value. Capacitor C initially is charged by current I1+I2 through Q1 and D5, yielding an increased slope relative to a desired slope. In fact the initial slope at time t1 is twice the desired slope and decreases as the forward bias on D5 decreases. At time t2 diode D5 is turned off, and the current I1 in transistor Q1 is equal to the current into the capacitor C so that C charges linearly at the desired slope.

At time t3 the voltage on the capacitor C crosses the threshold required to turn on diode D6. As D6 begins to conduct, current is diverted from the capacitor C and the slope decreases from the desired slope. This decrease becomes more prominent as D6 is forward biased further. The distortion in this time interval t3-t4 lasts longer than that of the time interval t1-t2 due to current being diverted from capacitor C as opposed to capacitor C receiving additional current. Finally at time t4 the amplitude clamp level is reached and the current in transistor Q1 is equal to the current in diode D6, i.e., current I1 flows through transistor Q1 and Schottky diode D6 into transistor Q6 of the opposite clamp circuit while current I2 flows through transistor Q4. The potential across capacitor C is held constant at the new amplitude level.

At time t5, analogous to time t1, transistors Q2 and Q3 turn on and Q1 and Q4 turn off in response to the opposite transition of Vin. However diode D6 continues to conduct until its forward voltage is decreased to below its threshold value. Capacitor C is discharged by Q3 and D6, yielding an increased slope relative to the desired slope The initial slope at t5 is twice the desired value and decreases as the forward bias on D6 decreases. During time t6-t7 when diode D6 is turned off and the current I2 through transistor Q3 is equal to the current from the capacitor C, the capacitor discharges linearly.

At time t7, analogous to time t3, the voltage on the capacitor C is crossing the threshold required to turn on diode D5. As D5 begins to conduct, current is diverted from the capacitor C and the slope of the voltage transition decreases from the desired value. This decrease in slope becomes more prominent as D5 is further forward biased. Finally at time t8 the opposite amplitude level is achieved as defined by the appropriate clamp circuit, and the current in diode D5 is equal to the current I2. The potential across C is held constant at the transition level defined by the clamp circuit. The length of the distorted time intervals, t1-t4 and t5-t8, is directly proportional to the overall transition time.

What is desired is an improved variable voltage transition circuit that virtually eliminates the distortion problems inherent in the prior art approach, as well as providing improved drift characteristics and thermal tail reduction.

SUMMARY OF THE INVENTION

Accordingly the present invention provides an improved variable voltage transition circuit having two pairs of matched current sources. A voltage transition circuit has a capacitor that is linearly charged/discharged by a constant current when an input voltage switches between two logic levels. Coupled to the capacitor by respective Schottky diodes are a high level and a low level clamp circuit. Coupled to each clamp circuit is a compensation circuit that almost instantaneously turns on/off the appropriate Schottky diode when the input voltage starts a transition from one voltage level to another. The compensation circuit is coupled to a second matching constant current source and includes compensating Schottky diodes and clamp circuits so that the bias to the Schottky diodes coupled to the capacitor changes when the input voltage starts to switch so that the Schottky diode almost instantaneously turns on/off. As a result there is little distortion in the resulting transition waveform across the capacitor due to the Schottky diode characteristics.

The objects, advantages and other novel features of the present invention are apparent from the following detailed description when read in conjunction with the appended claims and attached drawing.

DESCRIPTION OF THE PREFERRED EMBODIMENT

Figure 4A:
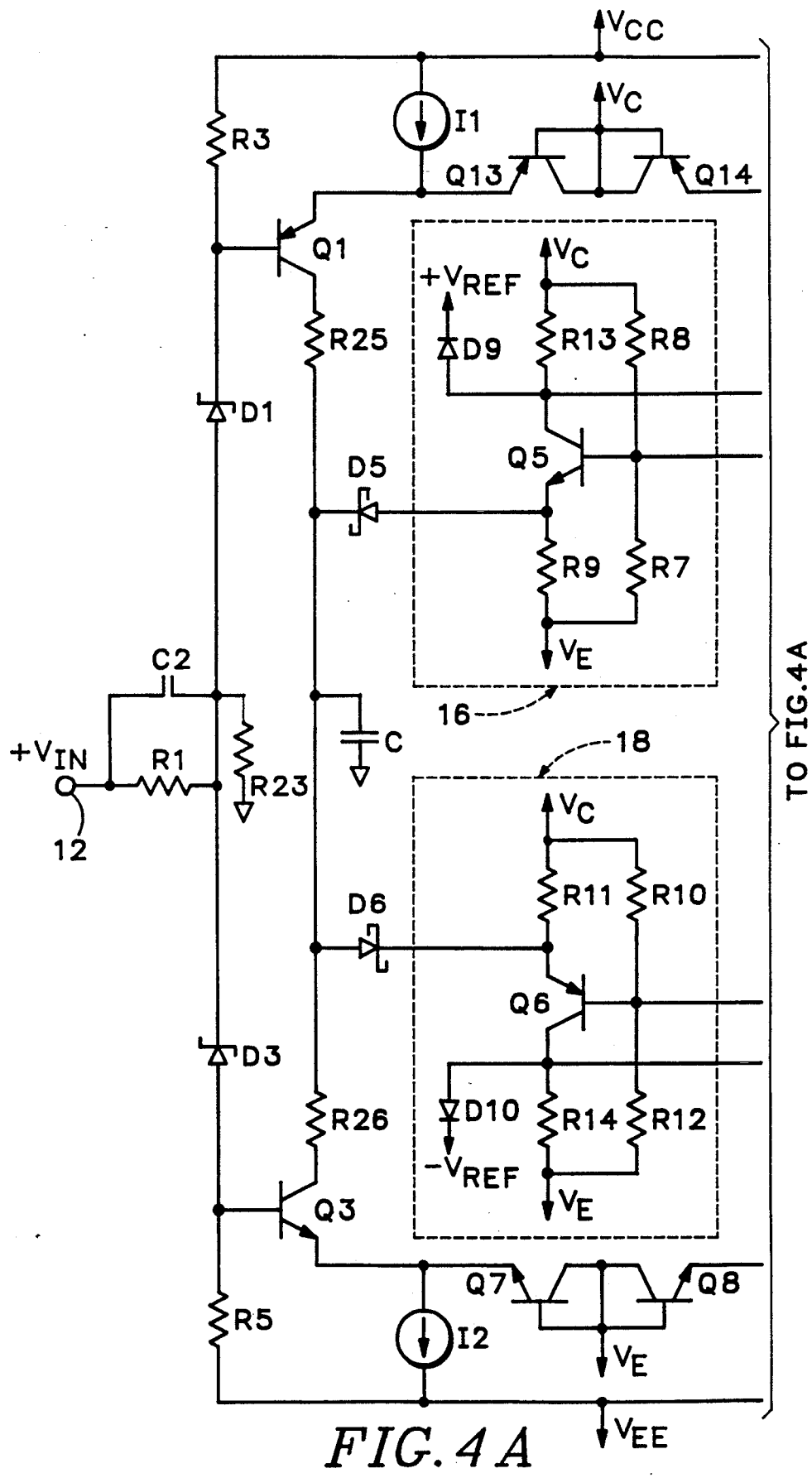
FIGS. 4A and 4B are schematic diagram views of an improved variable voltage transition circuit according to the present invention.
Figure 4B:
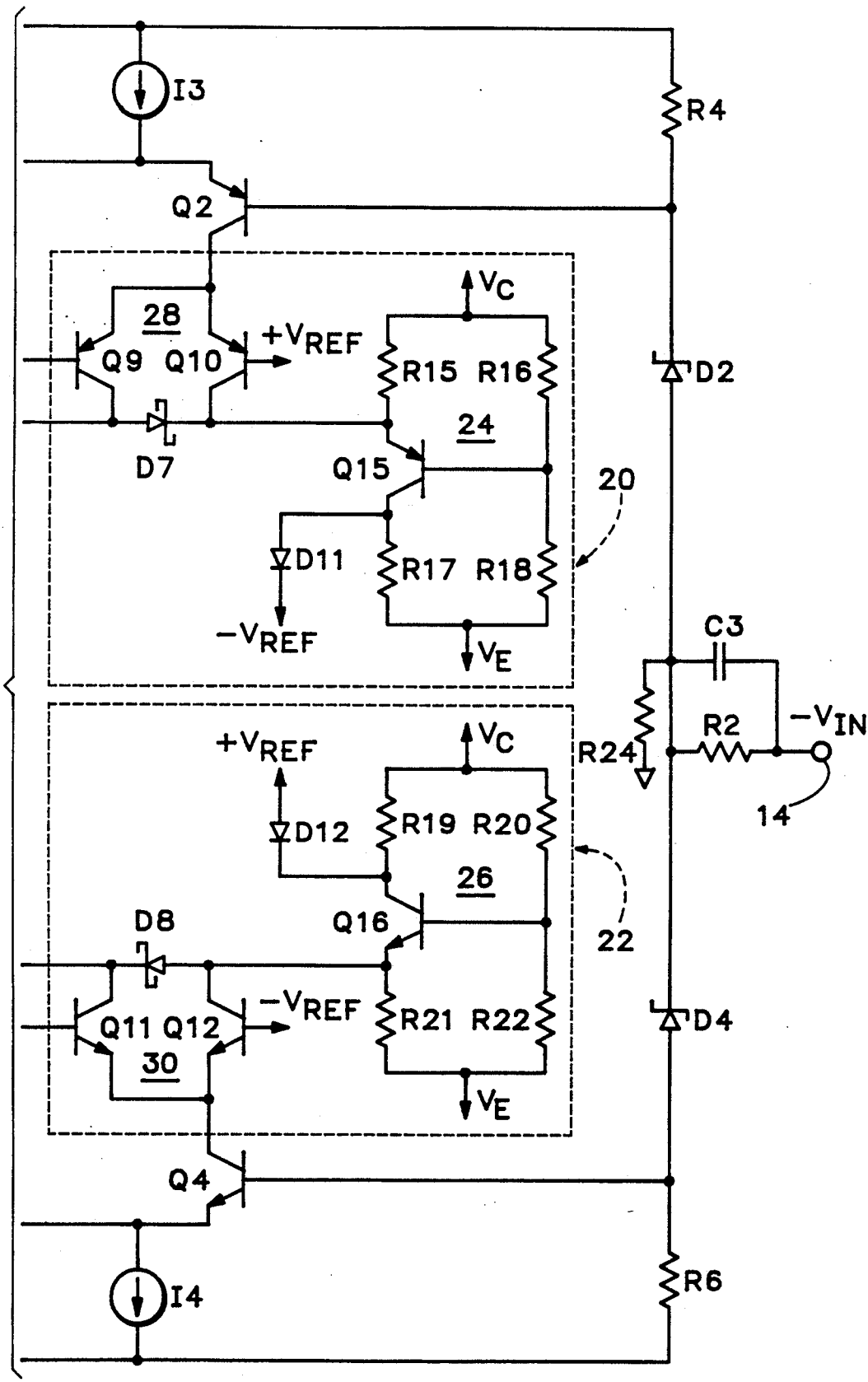

Referring now to FIG. 4 a differential input signal Vin is applied to input terminals 12, 14. The input voltage Vin is applied to the bases of transistors Q1-Q4 via appropriate biasing networks of resistors R3-R6 and Zener diodes D1-D4 situated between positive and negative voltage rails Vcc, Vee. Transistors Q1, Q2 are of one polarity while transistors Q3, Q4 are of the opposite polarity. The collectors of transistors Q1, Q3 are coupled to each other and to a capacitor C via respective collector resistors R25, R26. The emitters of transistors Q1, Q3 are coupled via respective current sources I1, I2 to the respective voltage rails Vcc, Vee. Also coupled to the capacitor C and the collectors of transistors Q1, Q3 via Schottky diodes D5, D6 are respective tracking clamp circuits 16, 18.

The emitters of transistors Q2, Q4 are coupled via respective current sources I3, I4 to the respective voltage rails Vcc, Vee. The current source I3 is matched to current source I2, and current source I1 is matched to current source I4. Transistors Q13, Q14 and Q7, Q8 provide a path for the current when the respective transistors Q1, Q3 or Q2, Q4 are turned off. The bases of transistors Q2, Q4 are coupled via appropriate bias networks of resistors R4, R6 and Zener diodes D2, D4 between the voltage rails Vcc, Vee to the opposite input terminal 14. Coupled between the collector of each transistor Q2, Q4 and the respective tracking clamp circuits 16, 18 are respective compensation circuits 20, 22. Each tracking clamp circuit 16, 18 has an emitter-follower transistor Q5, Q6 having its emitter coupled to the appropriate Schottky diode D5, D6 and to second voltage rails Ve, Vc via a resistor R9, R11. The base of each transistor Q5, Q6 is coupled to respective bias circuits of resistors R7, R8; R10, R12 between the second voltage rails Vc, Ve, and the collector is coupled via a resistor R13, R14 to one of the second voltage rails Vc, Ve and to a voltage reference +Vref, −Vref via diodes D9, D10.

The compensation circuits 20, 22 include fixed clamp circuits 24, 26 that correspond to the tracking clamp circuits 16, 18. The emitters of the fixed clamp circuit transistors Q15, Q16 are coupled to the bases of respective tracking clamp circuit transistors Q5, Q6 via respective switch networks 28, 30. Each switch network 28, 30 has a Schottky diode D7, D8 between the emitter of the fixed clamp transistor Q15, Q16 and the base of the corresponding tracking clamp transistor Q5, Q6. A pair of switch transistors Q9, Q10; Q11, Q12 have their emitters coupled together and to the collectors of respective transistors Q2, Q4, and have their collectors coupled to opposite ends of the Schottky diode D7, D8. The base of the switch transistor Q10, Q12 is coupled to an appropriate reference voltage +Vref, −Vref and the collector is coupled to the emitter of the fixed clamp transistor Q15, Q16, and the base of the other transistor Q9, Q11 is coupled to the collector of the tracking clamp transistor Q5, Q6. The transistors Q1, Q2, Q6, Q9, Q10, Q13–Q15 are of one polarity, and the remaining transistors Q3–Q5, Q7, Q8, Q11, Q12, Q16 are of the opposite polarity.

In operation when the input voltage Vin is at a high level at the first input terminal 12, and thus low at the other input terminal 14 and low across capacitor C, transistors Q2, Q3, Q9 conduct together with diodes D5, D7. Current I1 is shunted by diode-connected transistor Q13 to voltage rail Vc, current I2 flows from clamp transistor Q5 through Schottky diode D5 and transistor Q3, current I3 flows through transistors Q2, Q9 and Schottky diode D7 to fixed clamp transistor Q15, and current I4 flows from voltage rail Ve through diode-connected transistor Q8. The bias for tracking clamp transistor Q5 is determined by the voltage at the emitter of fixed clamp transistor Q15 and the drop across Schottky diode D7.

Figure 3:
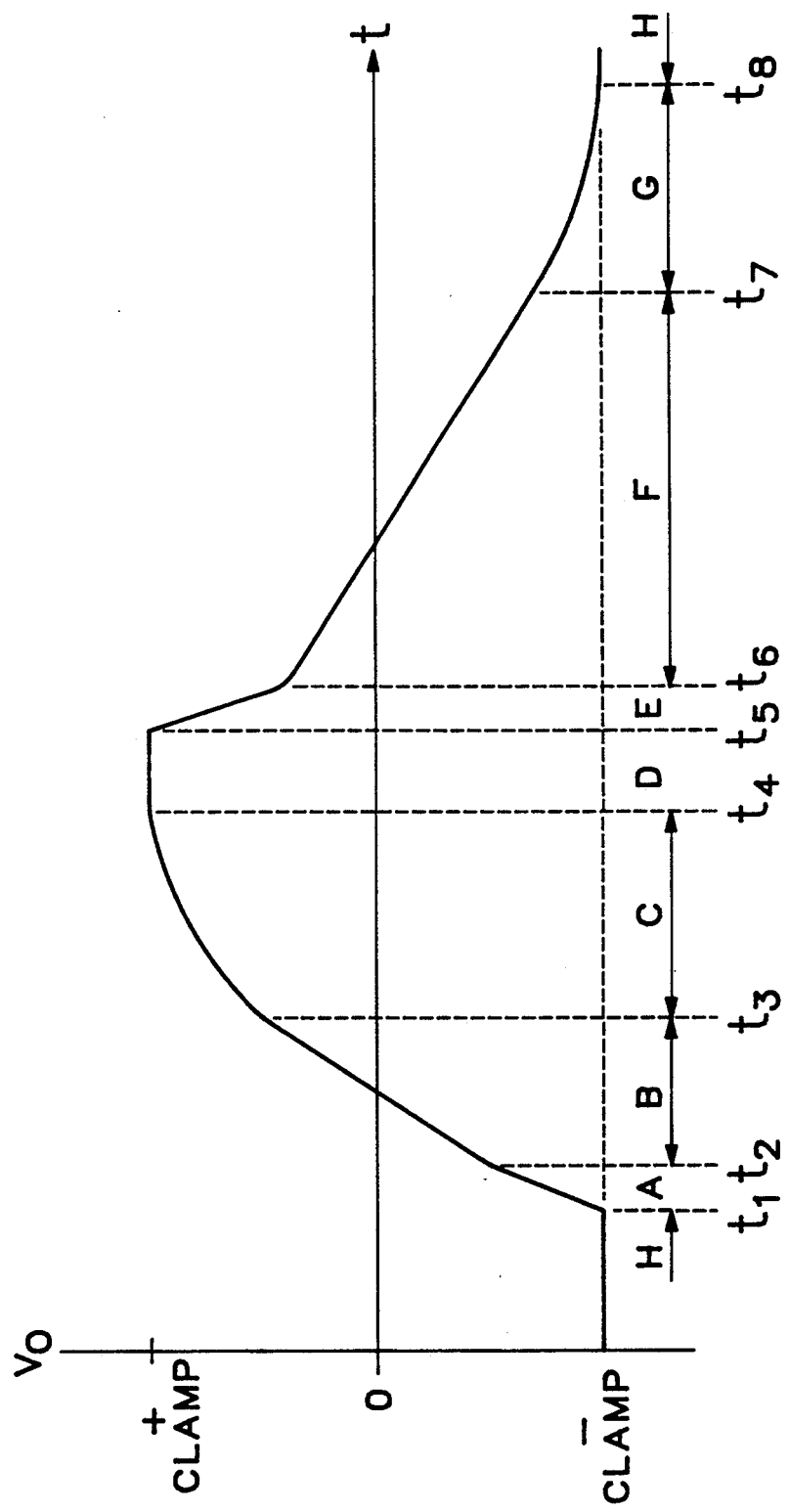
FIG. 3 is a diagram of the transition characteristic of the variable voltage transition circuit of the prior art.

When the input voltage Vin at terminal 12 transitions to a low level, transistors Q1, Q4, Q12 turn on. Transistor Q1 starts to charge capacitor C with current I1. As transistor Q2 turns off, transistor Q9 is cut off and the current through diode D7 goes to zero so that the base of the tracking clamp transistor Q5 drops in voltage by an amount necessary to turn off diode D5, the bias of Q5 now being determined by the voltage divider network of resistors R7, R8. Since tracking clamp transistor Q5 is an emitter follower with approximately unity gain, diode D5 cuts off almost at the same instant at which transistor Q1 starts to charge capacitor C. Thus the time interval, indicated "A" in FIG. 3, is reduced almost to zero, the time required to cut off Q9, D7 followed by the propagation delay of Q5. Also the interval A is independent of the value of the capacitor C. Therefore the current in transistor Q1 equals the current into the capacitor C, and the capacitor charges linearly.

When the voltage on the capacitor C crosses the threshold required to turn on the Schottky diode D6 and the diode starts to conduct, the voltage across tracking clamp load resistor R14 increases which changes the state of the switch circuit 30 so that transistor Q12 begins to turn off and transistor Q11 begins to turn on. This causes the base of tracking clamp transistor Q6, originally biased by the bias network of resistors R10, R12, to drop as diode D6 begins to conduct. As the voltage at the base of Q6 drops, the voltage across resistor R14 increases, thus further turning Q11 on and Q12 off until Q12 is cut off and current I4 flows through diode D8 and transistor Q11. At this point the base of transistor Q6 has dropped exactly by the voltage necessary to insure that all of the current I1 flows through diode D6 since diode D8 conducts I4 and diode D6 conducts I1 and current sources I1 and I4 are matched. This regenerative feedback forces the diode D6 turn on event to occur at high speed independently of the transition slope determined by the capacitor C. Thus the time interval "C" of FIG. 3 becomes very short, and the current in transistor Q1 equals the current through the Schottky diode D6. The potential across the capacitor C is now held constant, completing the transition. Current I1 flows through transistor Q1 and Schottky diode D6 to clamp transistor Q6, current I2 flows from voltage rail Ve, current I3 flows to voltage rail Vc, and current I4 flows from fixed clamp transistor Q16 through Schottky diode D8 and transistors Q11, Q4.

Figure 1:
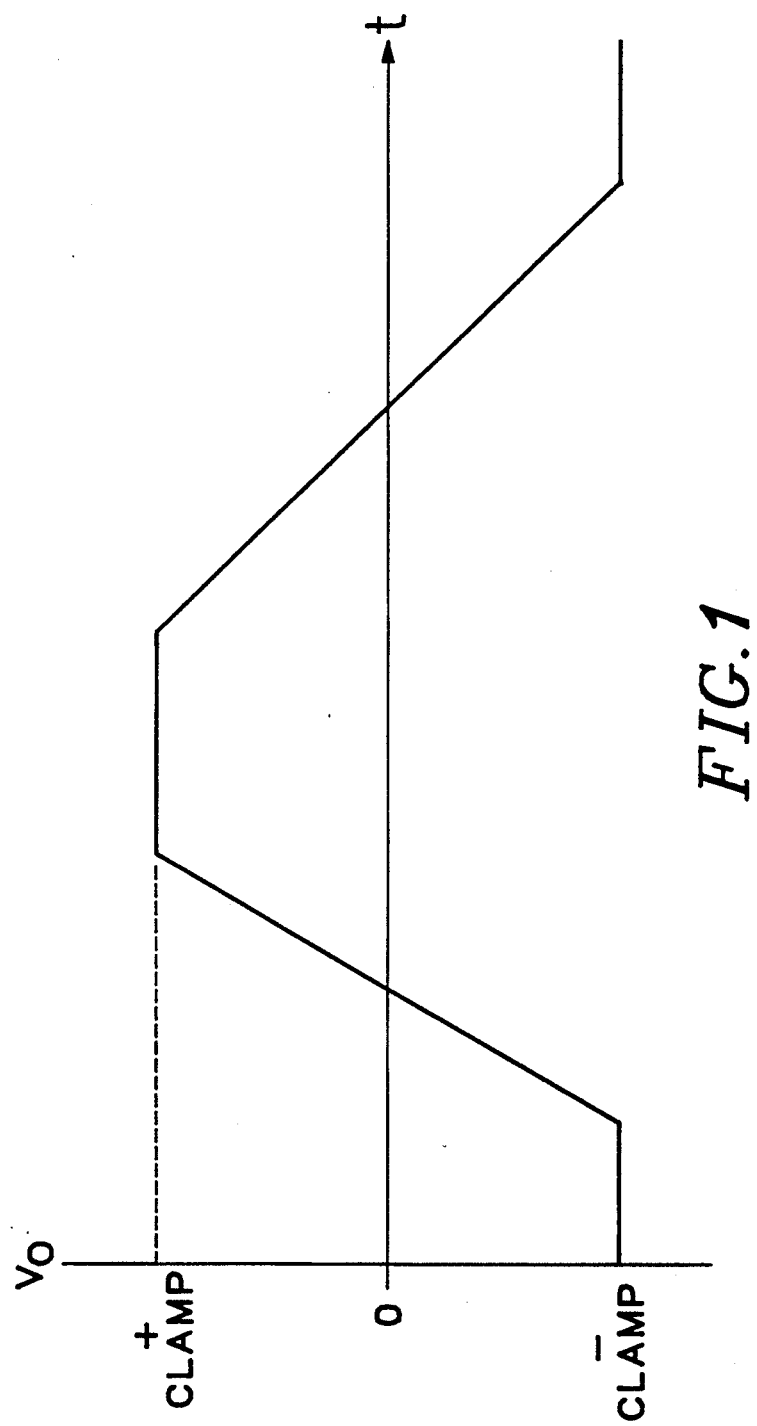
FIG. 1 is a diagram of the transition characteristic of an ideal variable voltage transition circuit.
Figure 2:
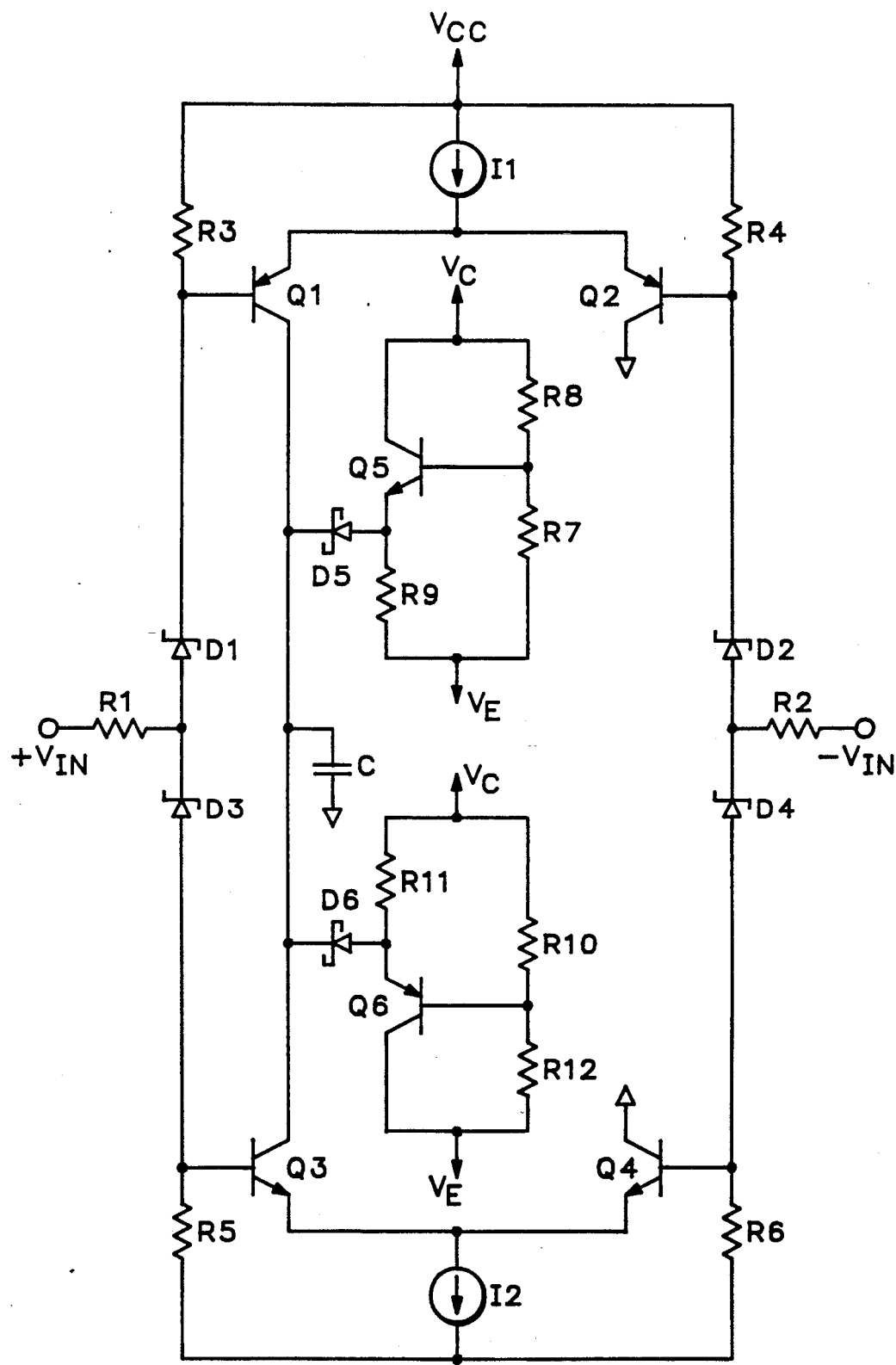
FIG. 2 is a schematic diagram view of a variable voltage transition circuit of the prior art.

When Vin transistions again to the opposite state, the process described above is reversed. The resulting output of the transition as seen across the capacitor C appears virtually like the ideal waveform shown in FIG. 1 since the intervals A, C, E, G are reduced so as to be near zero.

The bias voltage +/−Vref limits the tracking clamp circuits 16, 18 (and fixed clamp circuits 24, 26) so that the transistors Q5, Q6 do not saturate. The voltage at the collector of the tracking clamp transistor Q5 is kept high enough to keep the switch transistor Q9 turned off until the Schottky diode D5 starts to conduct. When diode D5 conducts, transistor Q9 turns on hard enough to cut off the opposite switch transistor Q10. Similarly the voltage at the collector of tracking clamp transistor Q6 is kept low enough to keep the switch transistor Q11 turned off until the Schottky diode D6 starts to conduct. When diode D6 conducts transistor Q11 turns on hard enough to cut off the opposite switch transistor Q12. Transistors Q1–Q4 are biased to switch when the input voltage Vin is at the midpoint of its transition between input levels.

the base of fixed clamp transistor Q15 is the voltage reference point for the negative clamp value at the Schottky diode D5 and capacitor C node. The value of this voltage is thermally stable when bias resistors R16, R18 are thermally matched and the base current in Q15 is small compared to the current flowing in resistors R16, R18. When Schottky diodes D5, D7 are conducting, the voltage at the capacitor C is $$Vo = Vbase15 + Vbe15 + Vd7 - Vbe5 - Vd5$$

where D5 and D7 are matched diodes and Q5 and Q15 have the same bias point, voltage and current. The voltage Vo has low drift that is dominated by the mismatch in Vbe between Q15 and Q5, typically matched to within 200uV per degree Celsius. The positive clamp functions identically to the negative clamp and has similar drift with the same polarity. Therefore the peak-to-peak amplitude of the waveform Vo is virtually independent of temperature. If this circuit drives a differential amplifier and the common-mode signal drives the opposite input of the differential amplifier, the resulting waveform Vo is temperature independent to a very high degree.

Also intervals A, C, E and G are near zero. Transistors Q5, Q15 have the same power dissipation during the intervals D and H. During the time intervals "C" and "D", as the clamp turns on, the emitter current of Q5 increases by the current in D5 and Vce5 drops to a clamped value set by diode D9. Fixed clamp transistor Q15 has identical increase in emitter current as transistor Q2 turns on and diode D11 limits the change in Vce15. Diodes D5 and D7 maintain equivalent power with respect to time. The net effect is a significant reduction in thermal tails, with time constants in the 100's of microseconds.

Additional enhancements shown in FIG. 4 include the addition of resistors R23, R24 and capacitors C2, C3 at the input terminals 12, 14. These filters provide an improvement in frequency response by adding a pole-zero pair. Resistors R25, R26 are added to lower the circuit Q with respect to the capacitor C and parasitic inductance.

Thus the present invention provides a variable voltage transition circuit with improved signal integrity, decreased rise and fall times, increased maximum clock frequency and improved timing characteristics by eliminating distortions in the transition characteristic using a compensation circuit that has a regenerative feedback circuit to turn on and off Schottky diodes virtually instantaneously when a transition of the input voltage occurs.

What is claimed is:

1. An improved variable voltage transition circuit of the type having means for switching a charge current and a discharge current from respective first current sources to and from a capacitor in response to a transition of an input voltage, means coupled to the capacitor by respective Schottky diodes for clamping the capacitor voltage between respective voltage levels, the improvement comprising:
   second current sources coupled to the switching means, second current sources providing currents matched to the charge and discharge currents respectively of the first current sources;
   a compensation circuit coupled between the switching means and the clamping means for turning on and off the Schottky diodes rapidly when the input voltage transitions to reduce distortion in the capacitor output caused by the Schottky diodes.

2. An improved variable voltage transition circuit as recited in claim 1 wherein the compensation circuit comprises:
   a clamp circuit;
   means coupled between the clamp circuit, the switching means and the clamping means for changing a bias voltage for the clamping means in response to the transition of the input voltage and to the detection of initial conduction by the Schottky diodes from the clamping means to rapidly turn on and off the Schottky diodes.

3. An improved variable voltage transition circuit as recited in claim 2 wherein the changing means comprises:
   a pair of transistors having the emitters coupled to the switching means to conduct the currents from the second current sources, having the base of one coupled to a reference voltage and the base of the other coupled to the clamping means, and having the collector of the one coupled to the clamp circuit and the collector of the other coupled to the clamping means, the base and collector of the other transistor coupled to provide regenerative feedback to the clamping means; and
   a Schottky diode coupled between the collectors of the pair of transistors;
   whereby when the input voltage transitions and the current from the second current sources is cut off from the pair of transistors, the bias to the clamping means is changed to turn off the Schottky diodes, and when the input voltage transitions and the current from the second current sources is applied to the pair of transistors, the bias to the clamping means is changed to turn the Schottky diodes full on when the Schottky diodes start to conduct.

* * * * *